United States Patent [19]

Bestwick et al.

[11] Patent Number: 5,571,376

[45] Date of Patent: Nov. 5, 1996

[54] QUANTUM DEVICE AND METHOD OF MAKING SUCH A DEVICE

[75] Inventors: Timothy D. Bestwick; Alistair H. Kean; Martin D. Dawson; Geoffrey Duggan, all of Oxfordshire, United Kingdom

[73] Assignee: Sharp Kabushiki Kaisha, Osaka, Japan

[21] Appl. No.: 404,508

[22] Filed: Mar. 15, 1995

[30] Foreign Application Priority Data

Mar. 31, 1994 [GB] United Kingdom .................. 9406488

[51] Int. Cl.$^6$ ................................................ H01L 21/31
[52] U.S. Cl. .................. 156/647.1; 156/659.11; 156/662.1; 437/128; 437/129; 437/969
[58] Field of Search ................................... 216/2, 46, 47, 216/51; 156/659.11, 647.1, 662.1; 437/128, 129, 969, 168; 148/DIG. 67, DIG. 95; 257/13, 14, 21, 96, 97, 627

[56] References Cited

U.S. PATENT DOCUMENTS 5,277,755  1/1994  O'Neill ................................. 156/647
5,440,147  8/1995  Kazmierski et al. .................. 257/13

FOREIGN PATENT DOCUMENTS 2238674  9/1990  Japan.

OTHER PUBLICATIONS

Kapon, Proceeding of the IEEE, vol. 80, No. 3, pp. 398–410, 1992, "Quantum Wire Lasers".
Stellini et al., Appl. Phys. Lett., 62(5), pp.458–460, 1993, "AlGaIn P Multiple–Quantum–Wire Lasers Grown by Gas Source Molecular Beam . . . ".
Simhony et al., Appl. Phys. Lett., 59(18), pp. 2225–2227, 1991, "Vertically Stacked Multiple–Quantum–Wire Semiconductor Diode Lasers."
Asada et al, IEEE Journal of Quantum Electronics, vol. QE–22, No. 9, pp. 1915–1921, 1986, "Gain and the Threshold of Three–Dimensional . . . ".
Behfar-Rad et al, IEEE Journal of Quantum Electronics, vol. 28, No. 5, pp. 1227–1231, 1992, "Monolithic AlGaAs–GaAs Single Quantum–Well . . . ".
Citrin et al, IEEE Journal of Quantum Electronics, vol. 29, No. 1, pp. 97–108, 1993, "Theory of Gain in Quantum–Wire Lasers Grown . . . ".
Search Report for European Appl. 95301771.2, mailed Aug. 1, 1995.
200 µA–Threshold Quantum Wire Lasers, Sandip Tiwari, (IBM Research Division) T. J. Watson Research Center, N.Y. pp. 627–628, IEEE Annual Mtg., Nov. 15–18, 1993.

*Primary Examiner*—R. Bruce Breneman
*Assistant Examiner*—Anita Alanko

[57] ABSTRACT

A quantum confined device is provided having raised portions formed on opposing walls of a groove, thereby defining a region of reduced width in the vicinity of the intersection of the walls. During fabrication, a "V" groove is formed in a substrate and then further masking and etching steps are performed on the walls of the groove to form the raised portions. Quantum confined devices can be formed within the groove by epitaxial deposition of semiconducting layers into the region of reduced width.

15 Claims, 3 Drawing Sheets

QUANTUM DEVICE AND METHOD OF MAKING SUCH A DEVICE

FIELD OF THE INVENTION

The present invention relates to quantum devices and to methods of making such devices.

"Substrate" as used herein refers to a layer in which or on which a feature or structure is formed. Substrate is not limited to being the lowermost layer in a structure.

BACKGROUND OF THE INVENTION

It is known, for example from "Quantum wire lasers", Eli Kapon, Proc IEEE 80 p398–410 (1992), that it is desirable to produce semiconductor devices in which the charge carriers are quantum confined in one dimension in extremely thin active layers (of approximately 20 nm or less), since such devices exhibit improved performance compared to comparable heterostructure devices. Confinement can be arranged to produce an essentially one dimensional structure, called a quantum wire. Structures in which the quantum confinement exists in three dimensions, i.e. the structure is very small in all three spatial dimensions, give rise to quasi-zero-dimensional structures, commonly known as a quantum dot or as a quantum box.

Quantum wire structures have been produced, as reported in "AlGaInP multiple-quantum-wire lasers grown by gas source molecular beam epitaxy", E. M Stellini, K. Y. Cheung, P. J. Pearah, A. C. Chen, A. M. Moy, and K. C. Hsieh, Appl. Phys. Lett 62 p458–460 (1993) and in "Vertically stacked multiple quantum wire semiconductor lasers", S. Simhony, E. Kapon, E. Colas, D. M. Hwang, N. G. Stoffel and P. Worland, Appl. Phys.lett 59, p2225–2227 (1991). However, these papers do not describe a satisfactory method of fabricating such quantum wire structures.

According to a first aspect of the present invention, there is provided a method of making a quantum confined device, comprising forming in a surface of a substrate, a depression having a plurality of walls extending into the substrate from the surface, and modifying the walls by forming a step in each wall so as to define in a base region of the depression a sub-depression of lateral size smaller than that of the depression.

It is thus possible to modify a depression, such as a groove or pit, formed by conventional etching steps to form a region therein which has a relatively small lateral dimension. Such a small dimension effectively provides sufficient dimensional containment to enable essentially one-dimensional, i.e. quantum wire, or zero-dimensional, i.e. quantum dot, structures to be formed therein.

Preferably the depression is formed by etching a semiconductor starting at a {100} surface thereof. The semiconductor may be masked so as to define a groove extending parallel with a <110> crystallographic direction such that the groove walls formed in the etching process are defined by {111} surfaces. This results in the formation of a well defined groove since the {111} surfaces are slow etching surfaces. Alternatively, the etching may be controlled to reveal higher index surfaces, such as a {311} or {511} surface.

In the case of a pit like depression, end surfaces, provided by third and fourth walls which intersect the first and second surfaces of the groove so as to close the groove, may also lie in {111} crystallographic planes.

Preferably a mask is applied to the first and second walls to define regions which are to be substantially protected from the etching. The mask may be applied to the surfaces by evaporative deposition. The mask may be silicon monoxide. Advantageously the upper ends of the walls of the groove have respective overhanging and/or upwardly extending mask regions which cooperate to define a slit. The slit may be used to limit the width of the mask applied to the first and second walls.

Preferably the deposited mask is deposited using a substantially unidirectional stream of atoms or vapour such that the overhanging mask region casts a shadow over part of the walls and thereby prevents the deposited mask being deposited in the shadowed regions. Advantageously the deposited mask for the first wall is deposited in a separate processing step to the deposition of the deposited mask for the second wall.

Preferably the masked first and second walls are anisotropically etched using a chemical etchant. Advantageously a surfactant may be included within the etching mixture so as to enhance wetting of the walls.

In the case of a pit, the mask may also be applied to third and fourth walls which close the groove. Advantageously the overhanging masks at the upper end of the limbs of the pit define an aperture and the overhanging masks are used to cast a shadow on each of the first to fourth walls during the deposition of the deposited mask. The third and fourth walls also undergo anisotropic etching so as to define a pit which may be used to form a quantum dot.

Preferably the masks are removed following the etching step. Silicon oxide masks may be dissolved using hydrofluoric acid.

According to a second aspect of the present invention, there is provided a quantum confined device, comprising a substrate having a depression formed in a surface thereof with a plurality of walls extending into the substrate from the surface, each of the walls having a raised portion defining in a base region of the depression a sub-depression of lateral size smaller than that of the depression.

Preferably the raised portions form respective steps on the walls.

Preferably the first and second raised portions are separated from one another. Thus the raised portions define a groove or a pit of reduced width therebetween.

The presence of the raised portions allows semiconductor layers to be formed within the depression which layers are not continuous over the walls. The discontinuity within the semiconductor layers enables the formation of one dimensional quantum device structures, or in the case of a pit, zero dimensional quantum device structures.

BRIEF DESCRIPTION OF THE DRAWINGS

The present invention will further be described, by way of example, with reference to the accompanying drawings, in which.

DETAILED DESCRIPTION OF THE INVENTION

Figure 1A:
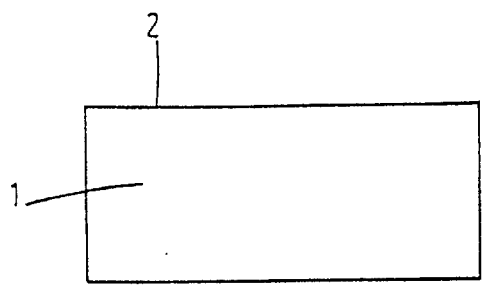
FIGS. 1a to 1h show the known processing steps for forming a groove in a semiconductor.
Figure 1B:
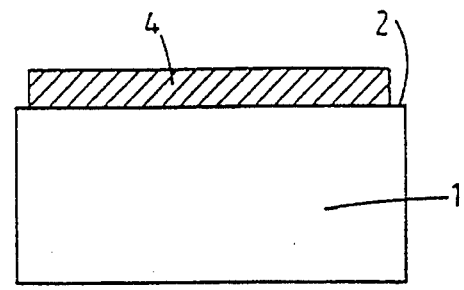
Figure 1C:
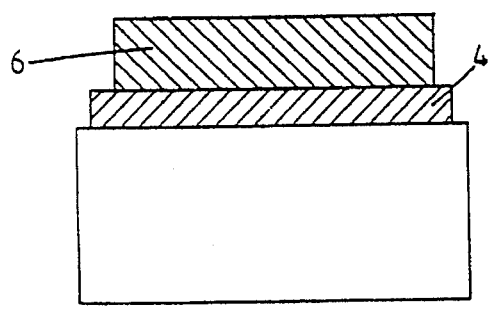
Figure 1D:
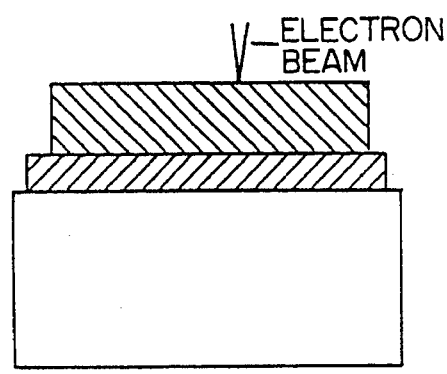
Figure 1E:
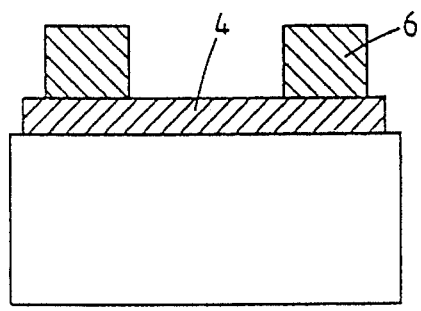

A substrate 1, such as gallium arsenide, is arranged to have an upper surface 2 in a {100} crystallographic plane. The substrate 1 is orientated such that the view thereof in FIG. 1a is along a <110> crystallographic direction. A mask layer 4 is deposited on the surface 2, as shown in FIG. 1b. The mask layer 4 may be a silicon dioxide layer, or similar, formed by plasma deposition. A layer of resist 6 is then deposited above the mask layer 4, as shown in FIG. 1c. An etching pattern is exposed to the resist 6 and the resist is then developed so as to fix the pattern therein, as shown in FIGS. 1d and 1e. The pattern may be defined by conventional optical or electron beam lithography steps and the choice of resist is made in accordance with the technique used.

Figure 1F:
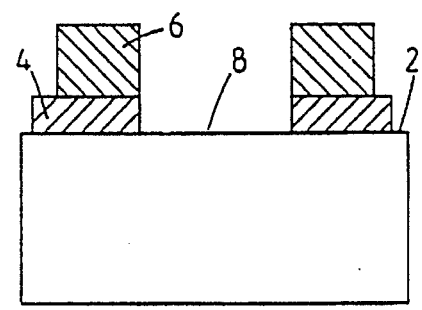
Figure 1G:
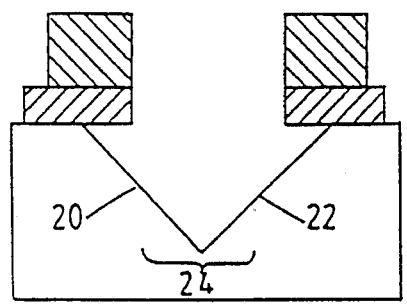

Following development of the resist, the mask layer 4 is selectively etched at the regions thereof unprotected by the resist 6 to reveal a portion 8 of the surface 2, as shown in FIG. 1f and thereby define a first mask. The substrate 1 is then immersed in an etchant (FIG. 1g) so as to form first and second walls 20 and 22, respectively, of a groove indicated generally as 24. A suitable etchant for etching {100} aligned gallium arsenide is an aqueous solution of ammonia and hydrogen peroxide. This etching solution etches the substrate anisotropically. Such etching is known as a "crystallographic etch". The etching proceeds slowly in the <111> directions, and consequently the etching favours the formation of walls along {111} crystallographic planes. Thus the walls 20 and 22 lie parallel to {111} crystallographic planes and the longitudinal axis of the groove 24 lies in a <110> direction.

Figure 1H:
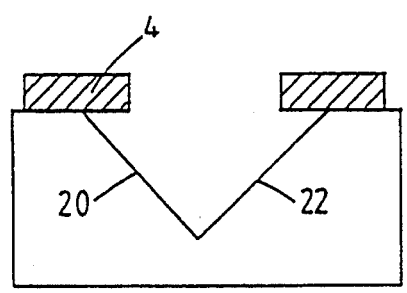

The resist 6 is removed from the mask layer 4, thereby leaving a structure as illustrated in FIG. 1h.

Figure 2A:
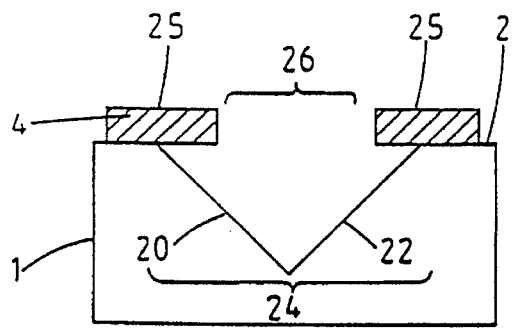
FIGS. 2a to 2d show the further processing steps to form a modified groove constituting an embodiment of the present invention.

The groove 24 is further modified to form a sub-groove for a one dimensional quantum structure. Regions 25 of the mask layer 4 which were protected from etching define a slit 26 therebetween. During the etching process, the etchant can nibble back underneath the mask layer 4. Thus the regions 25 overhang the groove 24 and the width of the slit 26 is less than the width of the groove 24 at the surface 2, as shown in FIG. 2a.

Figure 2B:
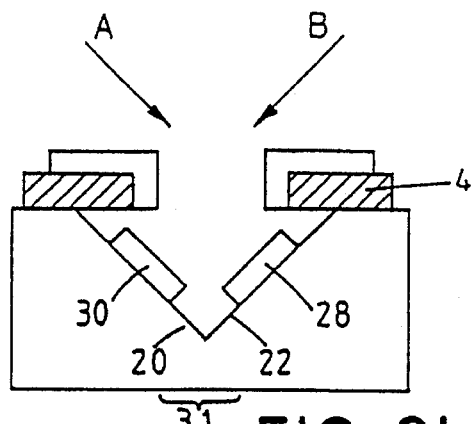

A second masking step is performed in which a further mask is evaporated at an angle onto the walls 20 and 22. Each wall is masked individually in order to form part of the further mask at an appropriate position on each of the walls. A beam of silicon monoxide molecules is directed towards the slit 26, and substantially perpendicularly with respect to the wall 22, i.e. along the direction of arrow A in FIG. 2b. The regions 25 of the first mask cast a shadow over part of the wall 22 and protect some of it from the beam of molecules. Thus a mask 28 is deposited only on the unshadowed portion of the wall 22. By controlling the width of the slit 26 and the angle of the molecular beam with respect to the slit, the position and width of the mask 28 can be controlled. The process is repeated to form a mask 30 on an unshadowed portion of the wall 20 when the beam of atoms is directed through the slit 26 and is perpendicular to the wall 20, i.e. along the direction of arrow B. The masks 28 and 30 are deposited to a thickness of approximately 10 nm and cooperate to define the further mask. Portions of the further mask also form on the regions 25 of the mask layer 4. Thus a region 31 near the apex 60 of the groove 24 remains unmasked.

Figure 2C:
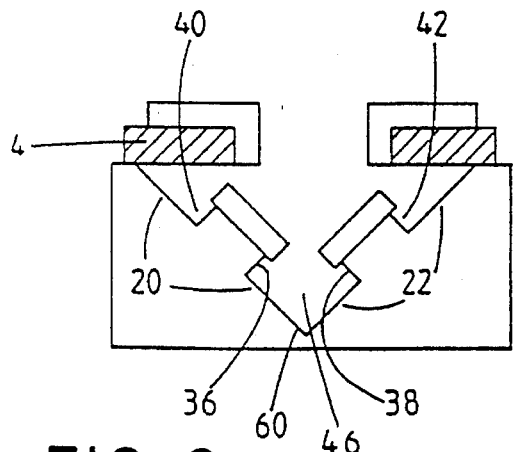

The structure is then subjected to a second crystallographic etch. The etchant further etches the walls 20 and 22, thereby enlarging the groove 24. The substrate 1 underlying the masks 28 and 30 is substantially protected from the etching, although the etchant can nibble back slightly at the edges of the mask, thereby exposing further walls 36, 38, 40 and 42 which are also defined by {111} crystallographic planes, as shown in FIG. 2c. The second etching is controlled so as to produce an etch depth normal to the existing walls 20 and 22 of approximately 20 nm. Thus, raised portions 43 and 44 are formed on the walls 20 and 22 and define therebetween a sub-depression 46 having a smaller lateral extent than the groove 24. It is advantageous to add a surfactant to the etching solution to enable it to wet the walls of the groove. A suitable surfactant is commercially available as SYNPERONIC N (Registered Trade Mark) from ICI plc.

Figure 2D:
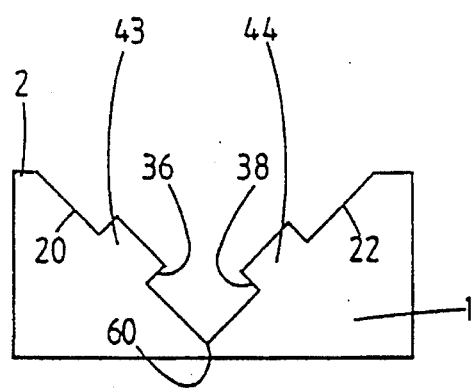

The layers of the masks 4, 28 and 30 are removed from the substrate, to yield a device as shown in FIG. 2d. The masks are removed using buffered hydrofluoric acid, which etches silicon oxides at a known rate.

The modified grooves can have a quantum device formed therein by the epitaxial growth of the semiconductor layers used to form the device structure. The semiconductor layers are discontinuous because of the steps 36 and 38 formed in the groove walls 20 and 22. This allows the direct growth of a quantum wire in the region of the apex 60 of the groove. The apex of the groove is bordered by a barrier material, i.e. the substrate 1 and thus carriers in the quantum wire experience a higher degree of confinement than is available with prior art production processes. Suitable epitaxial growth methods include solid-source molecular beam epitaxy (MBE), and gas-source molecular beam epitaxy (GSMBE).

Figure 3:
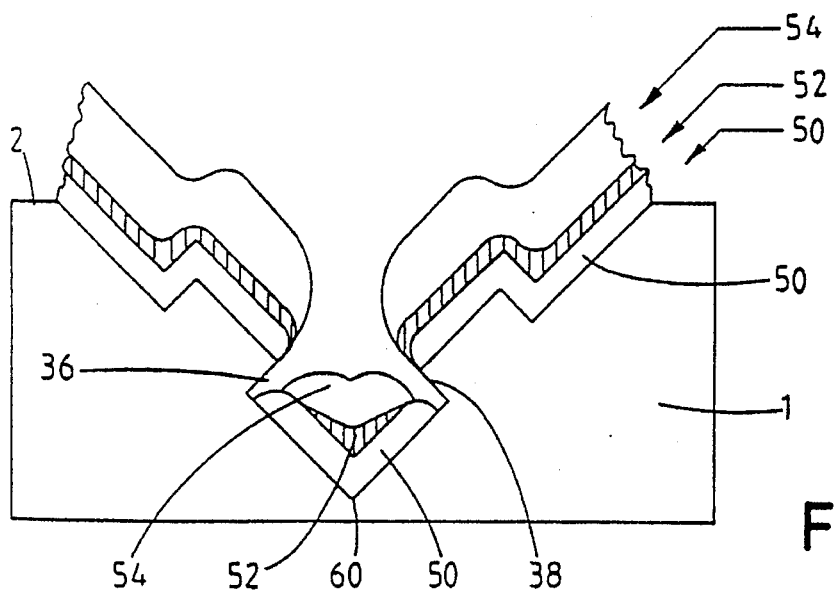
FIG. 3 is a cross sectional view of a quantum wire device constituting an embodiment of the present invention.

An electronic device can be formed by depositing a first layer of material, such as AlGaAs which has a relatively wide band-gap, on the surface of the groove 24 so as to form a lower barrier 50 (FIG. 3). A well layer 52 is deposited on the lower barrier 50. The well layer 52 is the layer that will contain the confined carriers, and may be a layer of GaAs. An upper barrier layer 54 is grown over the well layer 52. The upper barrier layer is a layer of GaAlAs. The barrier layers 50 and 54 are approximately 10 nm thick, whereas the well layer 52 is approximately 5 nm thick and typically between 10 and 50 nm wide.

The well layer 52 is grown with the device normal to the epitaxy source (not shown), whereas the barrier layers 50 and 54 may be formed with the sample being rotated at an inclined angle to the source so as to ensure that the barrier material spreads over a greater lateral distance than the well material. The well layer 52 is undopeal. The barrier layers are doped with a graded doping profile, n-type in the lower barrier 50 and p-type in the upper barrier, to allow injection of carriers into the well layer 52. The graded doping is arranged such that the portions of the barriers layers 50 and 54 adjacent the well layer 52 are substantially undoped.

Electrical efficiency of the device may be improved by inclining the device to nearly 45 degrees during the growth of the upper barrier 54, thereby causing the upper barrier layer to be relatively thin towards the apex of the modified groove. Additional semiconductor layers may be formed over the upper barrier layer 54.

Steps 36 and 38 near the apex 60 which define the structure enable well defined quantum devices to be fabricated. The steps 40 and 42 do not play a part in defining the quantum device.

Thus a quantum confined structure, in this case a quantum wire, is formed in the region of the apex 60 of the groove.

The above process can also be used with a truncated groove, much like a pit, to form a quantum dot. Instead of a groove, an inverted pyramidal depression is initially formed. Alternatively, a tetrahedral depression may initially be formed.

Figure 4A:
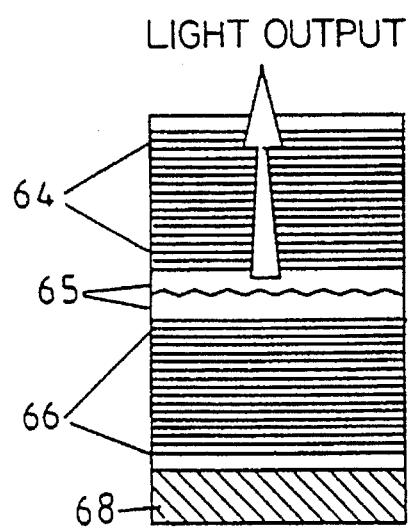
FIG. 4 is a schematic diagram of an opto-electric device having an active region comprising a plurality of quantum confined regions and constituting an embodiment of the present invention.
Figure 4B:
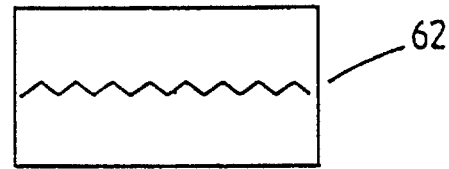

A plurality of quantum wires or quantum dots formed using the modified groove can be incorporated into the active region of a semiconductor device, for example, a laser or a photodetector. FIG. 4 illustrates a laser in which an active region 62, containing a plurality of quantum wires within a plurality of grooves, is sandwiched between first and second mirrors 64 and 66, respectively. The second mirror 66 is formed over a substrate 68. During the manufacture of such a device, the grooves in the active region 62 are planarised, for example using an epitaxial growth technique such as metal-organic vapour-phase epitaxy (MOVPE), before the mirror 64 and upper spacer 65 are deposited over the grooves.

Various modifications may be made within the scope of the invention. For instance, the substrate may be made of other materials which have suitable crystallographic structures and which can be etched anisotropically. Although it may be advantageous for the substrate to be made of a semiconductor material, for instance, so as to allow electrical injection into a quantum wire or dot, there may be applications where a non-semiconductor substrate, such as sapphire, may be used. It may also be appropriate to use the substrate itself as the lower barrier layer.

The etching to form the depression may start from a surface other than a {100} surface. For instance, an aqueous solution of sodium hydroxide and hydrogen peroxide may be used to produce triangular etch pits in the surfaces of {111}, {311}, and {511} gallium arsenide substrates.

It is thus possible to produce a structure which enables well controlled quantum devices having a good degree of confinement to be reliably fabricated.

What is claimed is:

1. A method of making a quantum confined device, comprising the steps of:

forming in a surface of a substrate a depression having a plurality of walls extending into the substrate from the surface, and modifying the walls by forming a plateau-like raised portion in each wall so as to define in a base region of the depression a sub-depression of lateral size smaller than that of the depression, wherein the plateau-like raised portion has a first step up from the depression and a second step down to the sub-depression.

2. A method as claimed in claim 1, wherein a first mask defining an opening is formed on a surface of the substrate, and the depression is formed by anisotropic etching of the substrate through the opening.

3. A method as claimed in claim 2, wherein a second mask for modifying the walls is deposited on parts of the walls to define an unmasked region in a base region of the depression.

4. A method as claimed in claim 3, wherein the second mask is deposited on the parts of the walls using a molecular beam directed through the opening at a plurality of angles with respect to the opening such that edges of the first mask defining the opening prevent the molecular beam from impinging on the walls in the base region of the depression.

5. A method as claimed in claim 3, wherein the depression is etched so as to leave first portions of the walls protected by the second mask proud of second portions of the walls in the base region.

6. A method as claimed in claim 1, wherein the depression is formed in a substrate having a cubic lattice, the surface of the substrate is parallel with a {100} crystallographic plane, and the depression is etched using an anisotropic etchant which has a slow etch along the <111> direction.

7. A method of making a quantum confined device, comprising the steps of:

forming in a surface of a substrate a depression having a plurality of walls extending into the substrate from the surface, modifying the walls by forming a step in each wall so as to define in a base region of the depression a sub-depression of lateral size smaller than that of the depression, and depositing a well layer within the sub-depression.

8. A method as claimed in claim 7, wherein the well layer is deposited between first and second barrier layers.

9. A method as claimed in claim 8, wherein at least one of the first and second barrier layers is doped and has a doping concentration which decreases towards an interface with the well layer.

10. A method as claimed in claim 1, wherein the depression comprises a groove and the plurality of walls comprises first and second walls.

11. A method as claimed in claim 10, wherein the depression is formed in a substrate having a cubic lattice, the surface of the substrate is parallel with a {100} crystallographic plane, the depression is etched using an anisotropic etchant which has a slow etch along the <111> direction, and the groove has a longitudinal axis along a <110> crystallographic direction.

12. A method as claimed in claim 1, wherein the depression comprises a tetrahedral pit and the plurality of walls comprises first, second, and third walls.

13. A method as claimed in claim 1, wherein the depression comprises a pyramidal pit and the plurality of walls comprises first, second, third, and fourth walls.

14. A method as claimed in claim 1, wherein the height of the plateau-like raised portion is about twenty nanometers.

15. A method as claimed in claim 10, wherein the groove is constituted of the first and second walls, and the groove has an apex at the intersection of the first and second walls.

* * * * *